United States Patent [19]

Tanaka

[11] Patent Number: 5,111,265
[45] Date of Patent: May 5, 1992

[54] COLLECTOR-TOP TYPE TRANSISTOR CAUSING NO DETERIORATION IN CURRENT GAIN

[75] Inventor: Shin-Ichi Tanaka, Tokyo, Japan

[73] Assignee: NEC Corporation, Tokyo, Japan

[21] Appl. No.: 446,423

[22] Filed: Dec. 5, 1989

[30] Foreign Application Priority Data

Dec. 6, 1988 [JP] Japan .................................. 63-309319

[51] Int. Cl.$^5$ .................. H01L 29/72; H01L 29/161; H01L 29/80; H01L 29/06
[52] U.S. Cl. ........................................ 357/34; 357/16; 357/22; 357/56; 357/35
[58] Field of Search ................... 357/16, 34, 4, 22, 61, 357/56, 89, 23.2, 35

[56] References Cited

U.S. PATENT DOCUMENTS

| | | | |
|---|---|---|---|
| 3,489,963 | 6/1967 | Gillett | 357/35 |
| 3,626,257 | 12/1971 | Esaki et al. | |
| 4,439,782 | 3/1984 | Holonyak, Jr. | |
| 4,450,463 | 5/1984 | Chin | |
| 4,635,343 | 1/1987 | Kuroda | |
| 4,645,707 | 2/1987 | Davies et al. | 357/30 |
| 4,688,068 | 8/1987 | Chaffin et al. | |
| 4,695,847 | 9/1987 | Baba et al. | |
| 4,792,832 | 12/1988 | Baba et al. | |
| 4,821,090 | 4/1989 | Yokoyama | |
| 4,825,264 | 4/1989 | Inata et al. | 357/16 X |
| 4,845,541 | 7/1989 | Xu et al. | 357/4 X |
| 4,849,934 | 7/1989 | Yokoyama et al. | |
| 4,873,558 | 10/1989 | Antreasyan et al. | 357/23.2 |

FOREIGN PATENT DOCUMENTS

| | | |
|---|---|---|
| 61-296765 | 12/1986 | Japan |
| 62-130561 | 6/1987 | Japan |
| 62-152165 | 7/1987 | Japan |
| 62-205658 | 9/1987 | Japan |
| 62-216361 | 9/1987 | Japan |

OTHER PUBLICATIONS

"Low Noise normally on and normally off two-dimensional electron gas field-effect transistors", Lavirdon et al., Appl. Phys. Lett. 40(6), 1982, pp. 530-532.

"A New Al$_{0.3}$Ga$_{0.7}$As/GaAs Modulation-Dopes FET", Kopp et al., IEEE Electron Device Letters, vol. ED-L-3, No. 5, May 1982, pp. 109-111.

"A Resonant-Tunneling Bipolar Transistor (RBT)—A New Functional ... Gain", Jap. Journal of Appl. Phys., vol. 26, No. 2, Feb. 1987, pp. L131-L133, Futatsugi et al.

"(Invited) MBE-Grown GaAs/N-AlGaAs heterostructures ... Transistors", Hiyamizu et al., Jap. Journal of Appl. Phys., vol. 21 (1982), Suppl; 21-1, pp. 161-168.

"A New Functional, Resonant-Tunneling Hot Electron Transistor (RHET)", Yokoyama et al., Jap. Journal of Appl. Phys., vol. 24, No. 11, Nov. 1985, p. L853.

Lakhani et al., "Combining resonant tunneling dioses for signal ... logic", Applied Physics Lett. 52(20), May 16, 1988, pp. 1684-1685.

Yoo et al., "Influence of spacer layer thickness on the current ... diodes", Applied Physics Lett. 56(1), Jan. 1, 1990, pp. 84-86.

Capasson et al., "Multiple negative transconductance .. . resonant tunneling", Applied Physics Lett. 53(12), Sep. 19, 1988, pp. 1056-1058.

Sen et al., "New Resonant-Tunneling Devices . . . Peak-to-Valley Ratio". IEEE Electron Dev. Letters, vol. 9, No. 8, Aug. 1988, pp. 402-404.

(List continued on next page.)

*Primary Examiner*—Rolf Hille
*Assistant Examiner*—Wael Fahmy
*Attorney, Agent, or Firm*—Burns, Doane, Swecker & Mathis

[57] ABSTRACT

The collector-top type transistor according to the present invention has at least principal semiconductor layers of an emitter layer, tunnel barrier layers having electron affinities smaller than those of the emitter and a base, the base layer, and a collector layer formed in the above-mentioned order on a semiconductor substrate in which the injection of the minority carriers from the emitter to the base is controlled by the tunneling mechanism via the tunnel barrier layer where the film thickness of the tunnel barrier layer in the extrinsic transistor region is regulated to be larger than that in the intrinsic transistor region.

11 Claims, 6 Drawing Sheets

OTHER PUBLICATIONS

Potter et al., "Three-dimensional integration of . . . three-state logic", Applied Physics Lett. 52(25), Jun. 20, 1988, pp. 2163-2164.

Tsuchiya et al., "Dependence of resonant tunneling current . . . structures", Applied Physics Lett. 49(2), Jul. 14, 1986, pp. 88-90.

Tsuchiya et al., "Dependence of resonant tunneling current . . . structures", Applied Physics Lett. 50(21), May 25, 1987, pp. 1503-1505.

Capasso et al., "Resonant Tunneling Gate Field-Effect Transistor", 2 pages, 1986 (357 *16).

Fig. 3(a)
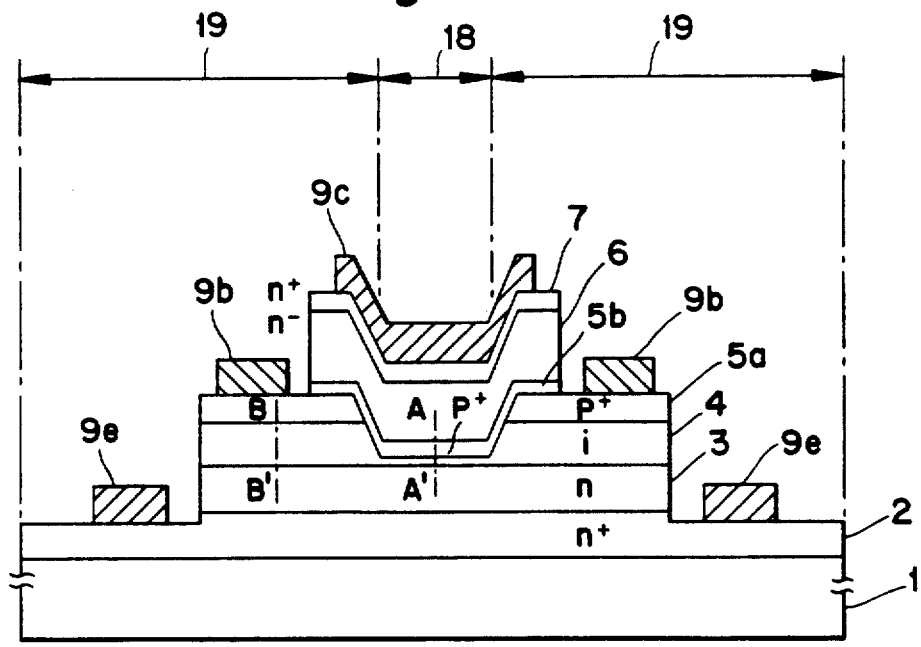
Fig. 3(b)
Fig. 3(c)
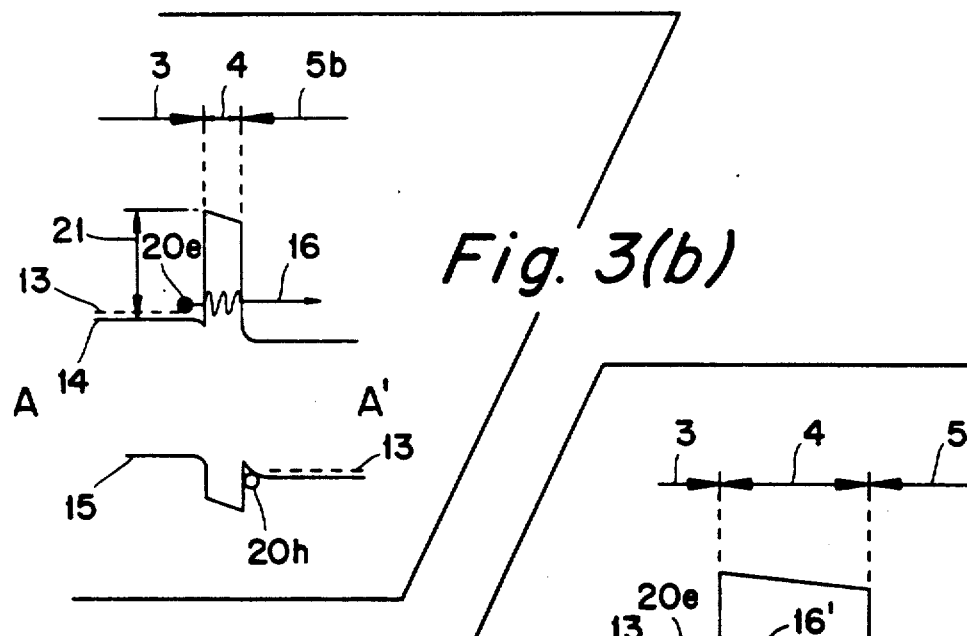

COLLECTOR-TOP TYPE TRANSISTOR CAUSING NO DETERIORATION IN CURRENT GAIN

BACKGROUND OF THE INVENTION

1. Field of the Invention

The present invention relates to collector-top type transistors, and more particularly to collector-top type transistors having the tunneling emitter structure.

2. Discussion of the Related Art

A variety of diversified high performance semiconductor devices are being realized in recent years as a result of advancement of the growth technology of multilayered thin film crystals of compound semiconductors. Among these, semiconductor devices generically termed the tunneling emitter transistors (TETs) equipped with an electron injection mechanism which utilizes the transmission plenomenon of the electron through a potential barrier by virtue of the quantum mechanical tunneling effect are being expected to be promising as the super-high speed semiconductor devices. The electron injection mechanism has a noteworthy significance in the semiconductor field having such aspects as it is applicable to heterojunction bipolar transistors (HBTs) and hot electron transistors (HETs) that are drawing attention as the next generation super-high speed devices, and further that it becomes possible to endow these devices with various kinds of functions by utilizing the resonance tunneling phenomenon obtainable by laminating a plurality of barrier layers.

Preparatory to a detailed description of the present invention, the conventional TET will be illustrated by using FIG. 1 and FIG. 2. As a common element which significantly limits the high speed performance of vertical semiconductor devices consisting basically of an emitter, a base, and a collector, one may mention the parasitic base-collector capacitance. In order to suppress the parasitic capacitance to a possible minimum, it has been known that the collector-top type device in which the collector is positioned above the emitter is more advantageous than the emitter-top type device with reversed arrangement. The emitter-top type device shown in FIG. 1 has a bipolar transistor structure in which the semiconductor layers of n+-GaAs as a collector contact layer 7, n−-GaAs as a collector layer 6, p+-GaAs as a base layer 5, i-Al$_{0.5}$Ga$_{0.5}$As as a tunnel barrier layer 4, n-GaAs as an emitter layer 3, and n+-GaAs as an emitter contact layer 2 are laminated sequentially on a semi-insulating semiconductor substrate 1. Such an emitter-top type TET has been disclosed in Japanese Patent Application Laid-Open No. 62-130561.

In this case, the base-collector capacitance that is generated in the plane of the base-collector junction is not limited to the intrinsic transistor region 18 but extended even to the extrinsic transistor region 19, so that the large value of the base-collector capacitance restricts the high-speed performance of the TET to a great extent.

On the other hand, in the case of the collector-top type device shown in FIG. 2, the order of lamination of the semiconductor layers is the opposite to that of the emitter-top type device. The base-collector capacitance is generated solely from the intrinsic transistor region 18 so that a substantial improvement of the high-speed performance might be expected.

However, while the device structure of the collector-top type has an advantage of suppressing the parasitic base-collector capacitance to a possible minimum, carrier (electron in this example) injection from the emitter to the base takes place as may be seen from FIG. 2 not only in the intrinsic transistor region 18 (area designated by an electron 17a in the figure) but also in the extrinsic transistor region 19 (area designated by electrons 17b in the figure). Electrons injected through the latter region not only do not contribute to the transistor operation but reduce the current gain to a large extent, which has been a drawback of the collector-top type device structure.

SUMMARY OF THE INVENTION

Accordingly, it is an object of the present invention to provide collector-top type TETs which do not give rise to a deterioration of the current gain by making an active use of the characteristic features of the tunneling injection mechanism in view of the above-mentioned drawbacks.

The semiconductor device according to the present invention includes a substrate, an emitter layer formed on the substrate, a base layer formed on a first portion of the emitter layer, a first barrier layer formed between the emitter layer and the base layer, the first barrier layer having an electron affinity smaller than those of the emitter layer and the base layer, a second barrier layer formed on a second portion of the emitter layer, the second barrier layer being in contact with the first barrier layer, having an electron affinity smaller than those of the emitter layer and the base layer, and having a film thickness greater than that of the first barrier layer, a base contact layer formed on the second barrier layer, the base contact layer being in contact with the base layer, a collector layer formed on the base layer, an emitter electrode connected to the emitter layer, a base electrode connected to the base contact layer, and a collector electrode connected to the collector layer.

The probability T for an electron (or hole) to tunnel through a tunnel barrier layer may be represented when T is sufficiently small composed with unity by $$T \simeq exp(-2\int [2m^*(V(x)-E)/\hbar^2]^{\frac{1}{2}}dx),$$

when $m^*$ is the effective mass of the electron (or hole), $V(x)$ is the value of the potential energy that depends on the position x in the direction perpendicular to a layer in the tunnel barrier layer, E is the energy of the electron (or hole), and $\hbar$ is the Planck's constant. If it can be assumed that the potential within the barrier layer has a constant value Vo, the tunneling probability T becomes $T \simeq exp(-W(m^*Vo)^{1/2}/A)$ (where A is a constant so that it will be seen that T decreases exponentially as the thickness W of the barrier layer or the effective mass of the carrier (electron or hole) that tunnels through the barrier layer gets large. In the transistor of the present invention, the thickness of the tunnel barrier layers are set so as to have that of the second barrier layer in the extrinsic transistor region to be greater than that of the first barrier layer in the intrinsic transistor region. Therefore, the probability for a carrier to transmit through the tunnel barrier layer by virtue of the tunneling effect will be much greater for the case of the event in the intrinsic transistor region. Consequently, the effect of the carrier injection in the extrinsic transistor region can be neglected in practice, and a device which has an excellent high-speed performance and a large current gain can be realized.

In this manner, according to the present invention, the collector-top type device structure which is important for enhancing the high performance of the tunneling emitter transistor can readily be realized without being hampered by the deterioration in the current gain. Since the present invention employs a method with reliable controllability in which the electron transmission probability of the tunneling phenomenon that serves as the carrier injection mechanism for the semiconductor device is modulated by the thickness of the barrier layer, fabrication of the device with high reliability becomes feasible.

Now, the film thickness of the first barrier layer is preferable to be in the range of 10 to 400 Å. If the thickness is smaller than 10 Å, control of the film thickness becomes difficult and the function as a tunnel barrier will no longer be fulfilled. On the other hand, if the thickness is greater than 400 Å, practical current density will no longer become obtainable.

Incidentally, the provision of a semi-insulating barrier layer in the extrinsic transistor region of the collector-top type TET is disclosed in Japanese Patent Application Laid-Open No. 62-152165. Since, however, the barrier layer used in the disclosure is of GaAs which is the same material as for the emitter and the base, so that the barrier layer cannot sufficiently block the carriers in the extrinsic transistor region, being unable to provide sufficient enhancement of the current gain.

DESCRIPTION OF THE DRAWINGS

The above and further objects, features, and advantages of the present invention will become more apparent from the following detailed description taken in conjunction with the accompanying drawings, wherein:

FIG. 3(a) and FIG. 6 are sectional views showing the structures of the tunneling emitter transistors according to the embodiments of the present invention;

FIGS. 3(b) and 3(c) and FIGS. 7(b) and 7(c) are diagrams for illustrating the conditions of the electron in infiltrating the barrier layer by the tunneling effect either by transmitting or being attenuated, in terms of the energy band diagrams within the device.

DESCRIPTION OF THE PREFERRED EMBODIMENTS

Figure 1:
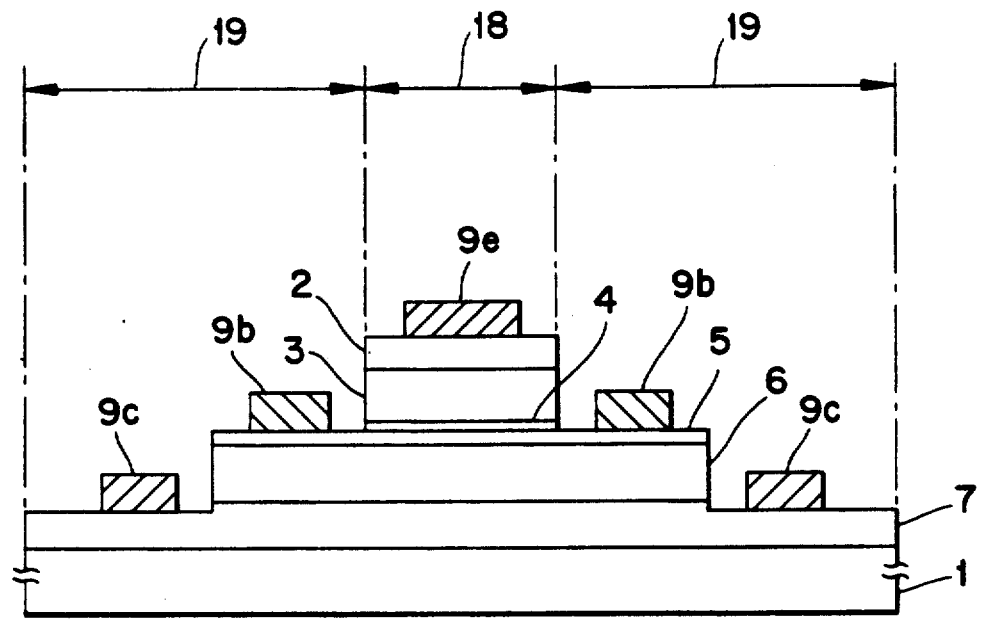
FIG. 1 is a sectional view showing the structure of the conventional emitter-top type tunneling emitter transistor.
Figure 2:
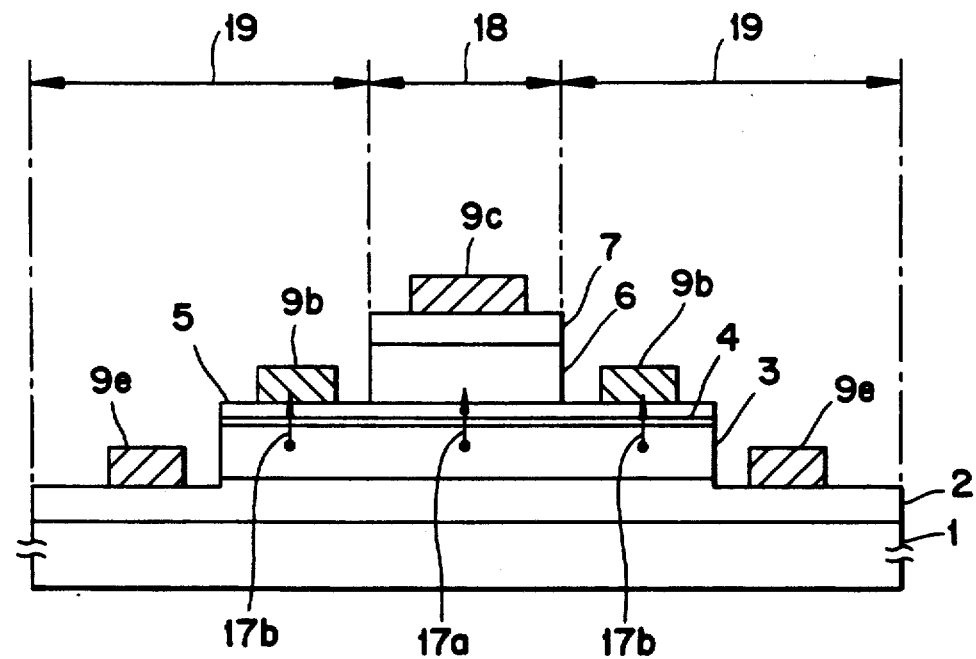
FIG. 2 is a sectional view showing the structure of the conventional collector-top type tunneling emitter transistor.
Figure 4A:
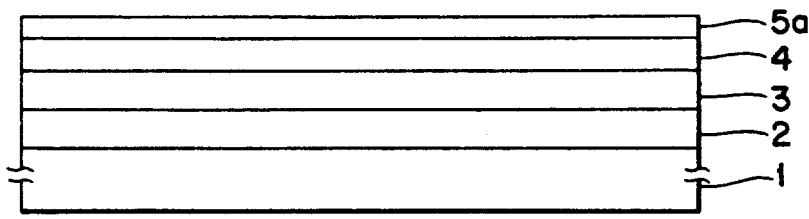
FIGS. 4(a)-(f) are diagrams showing the fabrication steps of the semiconductor device according to the present invention.
Figure 4B:
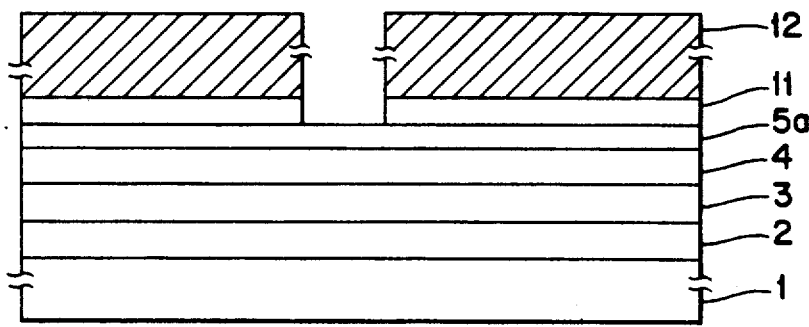
Figure 4C:
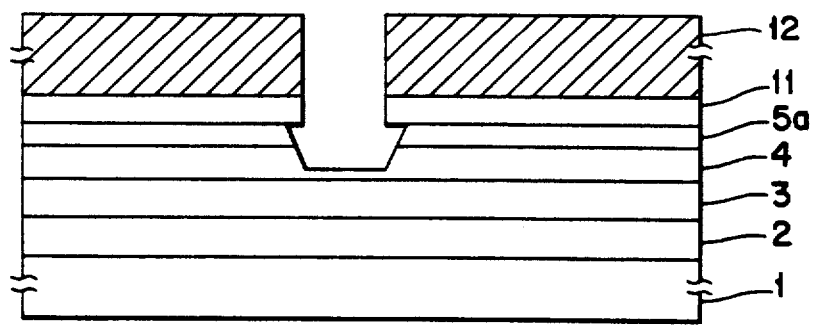
Figure 4D:
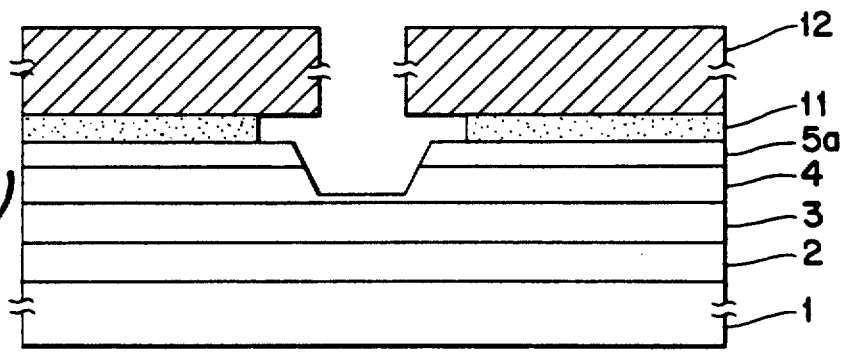
Figure 4E:
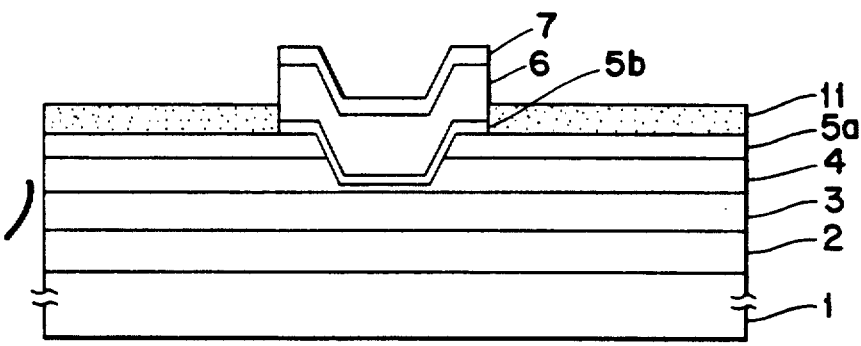
Figure 4F:
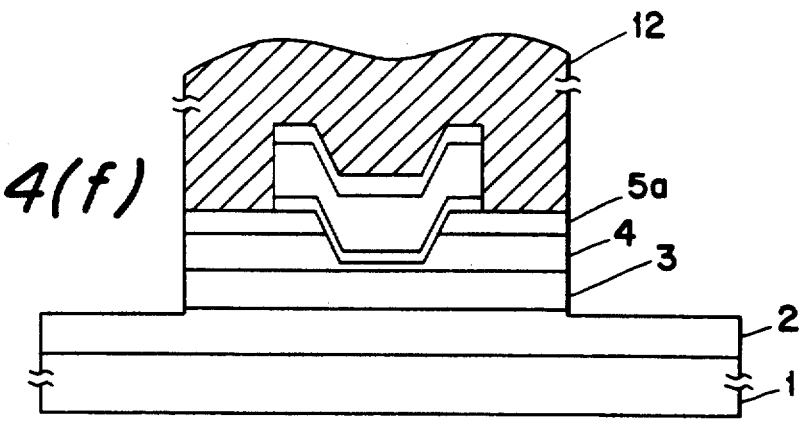
Figure 5:
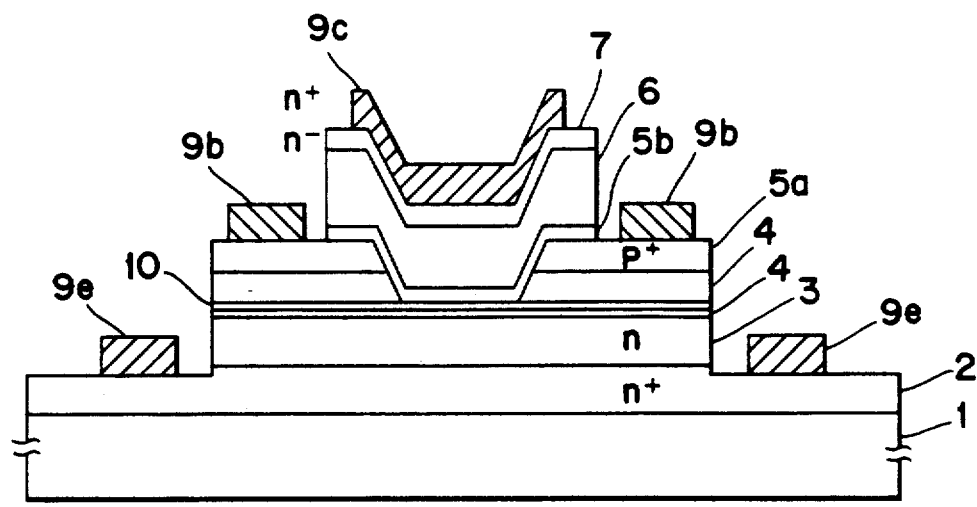
FIG. 5 and FIG. 7(a) and 7(d) are sectional views showing the structures of the tunnel barrier layer.

Using FIGS. 3(a) to 3(c) and FIGS. 4(a) to 4(f), one embodiment of the present invention will be described. Referring to FIG. 4(a), on a semi-insulating substrate 1, 500 nm of n+-GaAs as an emitter contact layer 2, 500 nm of n−-GaAs as an emitter layer, 150 nm of i-$Al_{0.5}Ga_{0.5}As$ as a barrier layer 4, and 100 nm of p+-GaAs as a base contact layer 5a are grown sequentially. Then, as shown in FIG. 4(b), an $SiO_2$ film 11 is formed to a thickness of 200 nm, an opening pattern is formed in a predetermined region of the wafer by lithography using photoresist 12, and the surface of the base contact layer 5a is exposed by an etching of the $SiO_2$ film 11 using diluted hydrofluoric acid with the photoresist 12 as the mask. Next, as shown in FIG. 4(c), the base contact layer 5a and the barrier layer 4, leaving only 20 nm of the barrier layer 4, are etched with the photoresist 12 and the $SiO_2$ film 11 as the mask. Subsequently, as shown in FIG. 4(d), the opening region of the $SiO_2$ film 11 is extended by an etching using diluted hydrofluoric acid with the photoresist 12 as the mask. Then, as shown in FIG. 4(e), after removing the photoresist 12, 60 nm of p+-GaAs as a base layer 5b, 400 nm of n-GaAs as a collector layer 6, and 100 nm of n+-GaAs as a collector contact layer 7 are grown by metal organic chemical vapor deposition (MOCVD), for example, in the region which is not covered with the $SiO_2$ film 11. Finally, as shown in FIG. 4(f), the device structure as shown in FIG. 3(a) is completed by forming the emitter, base, and collector electrodes 9e, 9b, and 9c, respectively, after revealing the surface of the emitter contact layer 2 for forming the emitter electrode.

As shown in FIGS. 3(b) and 3(c), since $Al_{0.5}Ga_{0.5}As$ of the tunnel barrier layer 4 has an electron affinity smaller than those of GaAs of the emitter layer 3 and the base layers, the electron has to pass through an energy barrier corresponding to the difference 21 of the electron affinities in order for the electron to flow from the emitter to the base. As shown in FIG. 3(a), the tunnel barrier layer 4 is formed so as to have a small thickness of 20 nm in the intrinsic transistor region 18 and a large thickness of 150 nm in the extrinsic transistor region 19. As a result, the wave function of electron 20e to be injected from the emitter into the base under the actual operating conditions undergoes a large attenuation as the electron infiltrates into the tunnel barrier layer in the extrinsic transistor region 19 (16' in FIG. 3(c)). In contrast, in the intrinsic transistor region 18 the electron can pass through the thin tunnel barrier layer 4 of 20 nm without suffering from a substantial attenuation (16 in FIG. 3(b)). In other words, injection of the electron in the extrinsic transistor layer 19 can be prevented. It should be mentioned here that the hole 20h has an effective mass m* which is far greater than that of the electron 20e so that the probability of transmission through the same tunnel barrier layer is extremely small compared with that of the electron as may be seen from the expression for the probability T given earlier. Therefore, there will be no apprehension of a degradation in the current gain due to the flow of the hole 20h from the base to the emitter.

It is to be noted that the fabrication method described above is not necessarily an easy one because there is required a high accuracy of etching in which the etching of the semiconductor layer has to be terminated by leaving an extremely small film thickness of the tunnel barrier layer. However, this difficult task of etching the tunnel barrier layer 4 may be rendered easier by inserting an etching stoppage layer 10 which automatically causes the etching to be stopped by leaving the desired thickness, at the time of growing the barrier layer. If an extremely thin InP film of 3 nm, for example, is used as an etching stoppage layer 10 for the barrier layer 4 consisting of $Al_{0.5}Ga_{0.5}As$, GaAs alone will be etched without etching InP when use is made of an etchant which is the mixture of phosphoric acid, hydrogen peroxide solution, and water. It should be noted that although InP is a material which does not lattice match with AlGaAs, the film thickness here is chosen to be very small so that there arise absolutely no adverse effects on the electrical properties or on the quality of the material such as the occurrence of dislocations in the crystal. The semiconductor material to be used as the etching stoppage layer 10 need not be limited to InP. In addition, various other methods of etching are available, for instance, the etching may be arranged to be stopped for the tunnel barrier layer 4 made of AlGaAs using an etching stoppage layer 10 made of GaAs, by the reactive ion etching (RIE) that employs a mixed gas of $CCl_2F_2$ and He.

Figure 6:
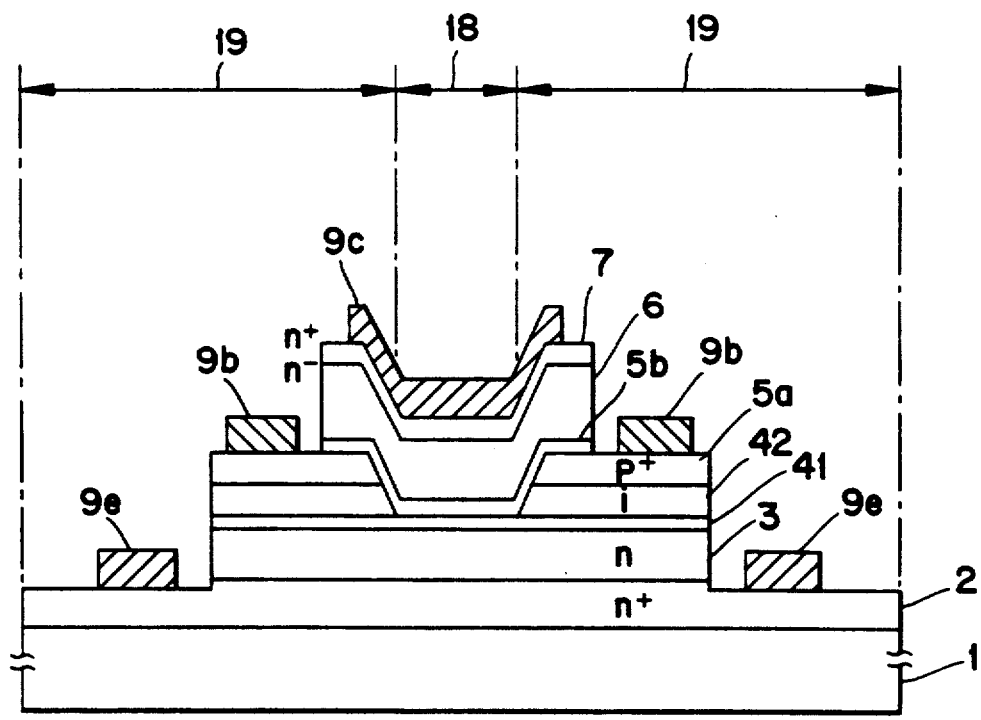

In FIG. 6, is shown a view for explaining another embodiment concerning the fabrication method of the semiconductor device according to the present invention. The figure shows that a hot electron transistor type TET can be fabricated by sequentially growing 500 nm of n+-InGaAs (having a mixed crystal composition which is lattice-matched to InP; similarly, for what follows), 500 nm of n−InGaAs as an emitter layer 3, 20 nm of i-InAlAs as a first barrier layer 41, 100 nm of InP as a second barrier layer 42, and 100 nm of n+-InGaAs as a base contact layer 5a on a semiinsulating substrate 1, and then growing 60 nm of n+-InGaAs as a base layer 5b, 200 nm of i-InAlAs as a collector layer 6, and 100 nm of n+-InGaAs as a collector contact layer 7 by the steps similar to those shown in FIG. 4. The etching of the tunnel barrier layer is carried out, for example, by the use of an etchant such as the mixture of phosphoric acid, hydrogen peroxide solution, and water which etches only InAlAs without encroaching upon InP, in order to etch only the second tunnel barrier layer 42 by leaving the first tunnel barrier layer 41. With these operations, the semiconductor device structure according to the present invention can be realized. Namely, of the electrons injected from the emitter 3 those in the intrinsic transistor region 18 can penetrate the thin first tunnel barrier layer 41 to the base layer 5b by virtue of the tunneling, whereas those in the extrinsic transistor region 19 are prevented from passing to the base contact layer 5a by the thick tunnel barrier layer consisting of the first tunnel barrier layer 41 and the second tunnel barrier layer 42.

Figure 7A:
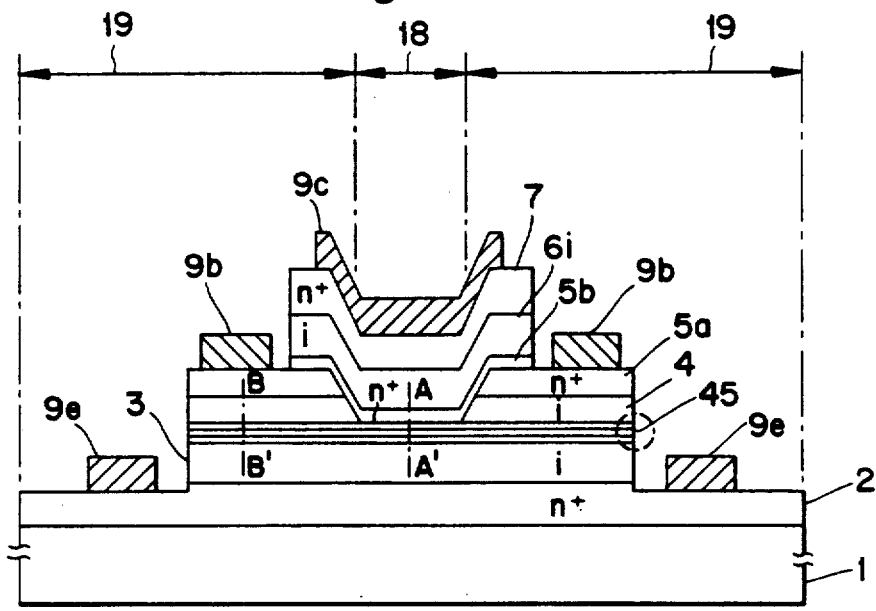
Figure 7D:
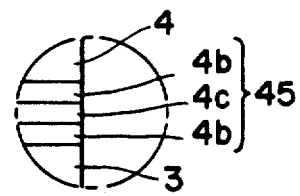
Figure 7B:
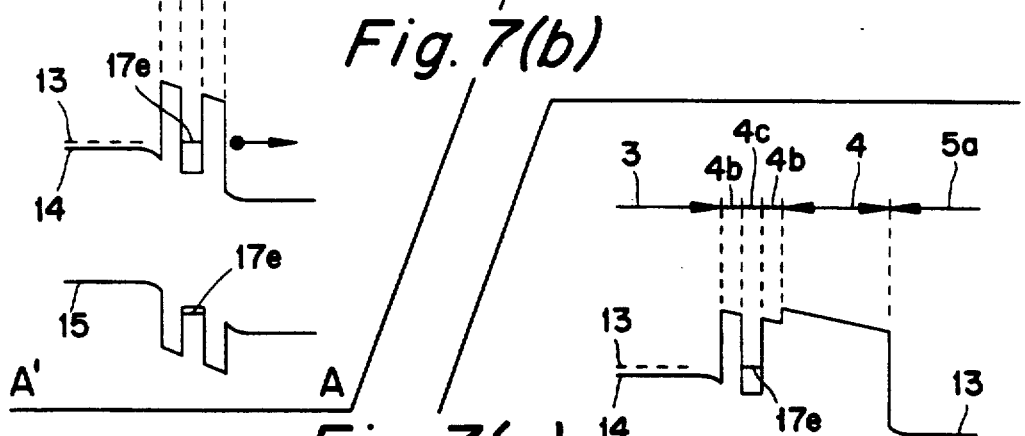
Figure 7C:
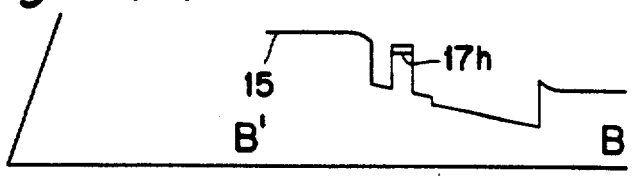

In the above fabrication method, not only a single layered semiconductor layer but also a layer consisting of a plurality of semiconductor layers may be used as the first tunnel barrier layer. In FIG. 7(a) is shown a diagram for illustrating still another embodiment of fabrication method according to the present invention. The first tunnel barrier layer 45 has a structure in which a quantum well confinement layer 4c shown in FIG. 7(d) consisting of 100 nm-thick InGaAs is sandwiched by quantum well barrier layers 4b each consisting of 150 nm-thick InP. If the Fermi level 13 of the emitter coincides energetically with the quantum mechanical discrete energy level 17e within the quantum well confinement layer 4c when a bias voltage is applied between the emitter end the base, the tunneling transmission probability of the electron increases resonantly so that the electron becomes possible to pass through the first tunnel barrier layer that takes on the quantum well structure. That among the electrons that passed through the first tunnel barrier layer 45 those from the intrinsic transistor region 18 are injected to the base layer 5b (FIG. 7(b)), while those from the extrinsic transistor region 19 are prevented from passing to the base contact layer 5a by the second tunnel barrier layer 4 consisting of InAlAs (FIG. 7(c)), is as already described before.

In the embodiments described in the foregoing use has been made of semiconductor material systems of AlGaAs/GaAs and InAlAs/InGaAs/InP, but the material systems need not be limited to those mentioned above and $Si_xGe_{1-x}/Si$, GaAs/Ge, and the like may also be used, and still further, they need not be of a lattice-matched system but may be of a non-lattice-matched system.

What is claimed is:

1. A semiconductor device comprising:
   a substrate;
   an emitter layer formed on said substrate;
   a first barrier layer formed on said emitter layer with an area smaller than said emitter layer;
   a second barrier layer formed on said emitter layer, said second barrier layer being in lateral contact with said first barrier layer, and having a film thickness greater than that of said first barrier layer through which electric carriers substantially do not permeate by tunneling effect;
   a base layer formed on said first barrier layer, said first and second barrier layers having an electron affinity smaller than that of said emitter layer and said base layer, and said first barrier layer having a thickness through which electric carriers may permeate to said base layer by tunneling effect;
   a base contact layer formed on said second barrier layer, said base contact layer being in contact with said base layer;
   a collector layer formed on said base layer;
   an emitter electrode formed electrically connected to said emitter layer;
   a base electrode formed electrically connected to said base contact layer; and
   a collector electrode formed electrically connected to said collector layer.

2. A semiconductor device as claimed in claim 1, wherein the film thickness of said first barrier layer is in the range of 10 to 400 Å.

3. A semiconductor device as claimed in claim 1, wherein said emitter layer and said base layer are GaAs layers, and said first barrier layer and said second barrier layer are AlGaAs layers.

4. A semiconductor device as claimed in claim 3, further comprising an additional layer of InP between said base layer and said first barrier layer, the total thickness of said additional and said first barrier layers being a thickness through which electric carriers may permeate to said base layer by tunneling effect.

5. A semiconductor device as claimed in claim 1, wherein said emitted layer and said base layer are InGaAs layers, said first barrier layer is a first InAlAs layer and a first InP layer on said first InAlAs layer, and said second barrier layer consists of a second InAlAs layer a second InP layer formed on said second InAlAs layer and a third InAlAs layer formed on said second InP layer.

6. A semiconductor device as claimed in claim 1, wherein said first barrier layer has a resonant tunneling barrier structure.

7. A semiconductor device as claimed in claim 6, wherein said first barrier layer consists of first and second semiconductor layers having electron affinities smaller than that of said emitter layer and said base layer, and a third semiconductor layer having an electron affinity larger than those of said first and second semiconductor layers, said third semiconductor layer being formed between said first and second semiconductor layers.

8. A semiconductor device as claimed in claim 7, wherein said emitter and base layers are InGaAs, said collector layer is InAlAs, said first and second semiconductor layers are InP layers, and said third semiconductor layer is an InGaAs layer.

9. A semiconductor device comprising:
substrate;
an emitter layer formed on said substrate;
a first barrier layer formed on said emitter layer, said first barrier layer having an electron affinity smaller than that of said emitter layer and a thickness through which electric carriers may permeate by tunneling effect;
a second barrier layer formed on said first barrier layer, said second barrier layer having an electron affinity smaller than that of said emitter layer, a total thickness of said first and second barriers is such that electric carriers substantially do no permeate by tunneling effect;
a base contact layer formed on said second barrier layer;
a hole formed in said second barrier layer and said base contact layer, said hole exposing said first barrier layer;
a base layer formed on said exposed first barrier layer, extending over said second barrier layer exposed to said hole and said base contact layer, said base layer having an electron affinity larger than that of said first barrier layer and second barrier layer;
a collector layer formed on said base layer;
a first electrode formed electrically connected to said emitter layer;
a second electrode formed electrically connected to said base contact layer; and
a third electrode formed electrically connected to said collector layer.

10. A semiconductor device as claimed in claim 9, wherein the film thickness of said first barrier layer is in the range of 10 to 400 Å.

11. A semiconductor device as claimed in claim 9, further comprising a third barrier layer formed between emitter layer and said first barrier layer and a fourth barrier layer formed between said first and third barrier layers, said third barrier layer having an electron affinity smaller than that of said emitter layer and said base layer and said fourth barrier layer having an electron affinity larger than that of said first and third barrier layers to form a potential well for a resonant tunneling barrier structure with said first, third and fourth barrier layers.

* * * * *